United States Patent
Abbott, Jr. et al.

(10) Patent No.: US 9,469,107 B2
(45) Date of Patent: Oct. 18, 2016

(54) THERMAL INKJET PRINTHEAD STACK WITH AMORPHOUS METAL RESISTOR

(71) Applicant: Hewlett-Packard Development Company, L.P., Houston, TX (US)

(72) Inventors: James Elmer Abbott, Jr., Corvallis, OR (US); Roberto A. Pugliese, Corvallis, OR (US); Greg Scott Long, Corvallis, OR (US)

(73) Assignee: HEWLETT-PACKARD DEVELOPMENT COMPANY, L.P., Houston, TX (US)

( * ) Notice: Subject to any disclaimer, the term of this patent is extended or adjusted under 35 U.S.C. 154(b) by 0 days.

(21) Appl. No.: 14/787,729

(22) PCT Filed: Jul. 12, 2013

(86) PCT No.: PCT/US2013/050205
§ 371 (c)(1),
(2) Date: Oct. 28, 2015

(87) PCT Pub. No.: WO2015/005934
PCT Pub. Date: Jan. 15, 2015

(65) Prior Publication Data
US 2016/0114584 A1    Apr. 28, 2016

(51) Int. Cl.
*B41J 2/14* (2006.01)
*B41J 2/16* (2006.01)

(52) U.S. Cl.
CPC .......... *B41J 2/14129* (2013.01); *B41J 2/14088* (2013.01); *B41J 2/14112* (2013.01);
(Continued)

(58) Field of Classification Search
CPC .... B41J 2/14; B41J 2/14016; B41J 2/14088; B41J 2/14112; B41J 2/14129
See application file for complete search history.

(56) References Cited

U.S. PATENT DOCUMENTS

| 4,288,302 A | 9/1981 | de Nora et al. |
| 4,335,389 A | 6/1982 | Shirato et al. |

(Continued)

FOREIGN PATENT DOCUMENTS

| CN | 101035978 | 9/2007 |
| CN | 101449362 | 6/2009 |

(Continued)

OTHER PUBLICATIONS

Baker et al., High-Temperature Oxidation Behavior of a New Ni—Cr—Mo—Si Alloy, Jan. 2, 2013, http://www.specialmetals.com/documents/High%20Temperature%20Oxidation%20behavior%20of%20a%20new%20NiCrMoSi%20Alloy.pdf.

(Continued)

*Primary Examiner* — Geoffrey Mruk
(74) *Attorney, Agent, or Firm* — Thorpe North & Western LLP

(57) ABSTRACT

The present disclosure is drawn to a thermal inkjet printhead stack with an amorphous metal resistor, including an insulated substrate and a resistor applied to the insulated substrate. The resistor can include from 5 atomic % to 90 atomic % of a metalloid of carbon, silicon, or boron; and from 5 atomic % to 90 atomic % each of a first and second metal of titanium, vanadium, chromium, cobalt, nickel, zirconium, niobium, molybdenum, rhodium, palladium, hafnium, tantalum, tungsten, iridium, or platinum, where the second metal is different than the first metal. The metalloid, the first metal, and the second metal can account for at least 70 atomic % of the amorphous thin metal film.

17 Claims, 2 Drawing Sheets

(52) U.S. Cl.
CPC .............. *B41J 2/164* (2013.01); *B41J 2/1646* (2013.01); *B41J 2/14016* (2013.01); *B41J 2202/03* (2013.01); *B41J 2202/11* (2013.01)

(56) References Cited

U.S. PATENT DOCUMENTS

| | | | |
|---|---|---|---|
| 5,479,197 | A | 12/1995 | Fujikawa et al. |
| 5,790,154 | A | 8/1998 | Mitani et al. |
| 5,966,153 | A | 10/1999 | Mitani et al. |
| 6,142,612 | A | 11/2000 | Whitman |
| 6,145,914 | A | 11/2000 | Downey et al. |
| 6,146,914 | A | 11/2000 | Burke et al. |
| 6,198,143 | B1 | 3/2001 | Ohsaki |
| 6,299,294 | B1 | 10/2001 | Regan |
| 6,645,560 | B2 | 11/2003 | Zhao et al. |
| 6,676,246 | B1 * | 1/2004 | Anderson ............ B41J 2/14129 347/62 |
| 6,715,859 | B2 | 4/2004 | Pan |
| 6,769,762 | B2 | 8/2004 | Saito et al. |
| 2002/0033750 | A1 | 3/2002 | Oizumi et al. |
| 2008/0151005 | A1 | 6/2008 | Kubo et al. |
| 2012/0156395 | A1 | 6/2012 | Bilello |
| 2013/0162724 | A1 | 6/2013 | Pugliese, Jr. et al. |
| 2016/0075136 | A1 * | 3/2016 | Abbott, Jr. ............ B41J 2/14112 347/62 |

FOREIGN PATENT DOCUMENTS

| | | |
|---|---|---|
| CN | 101533876 | 9/2009 |
| JP | S556497 | 1/1980 |
| JP | H08209327 | 8/1996 |
| JP | 10157124 | 6/1998 |
| JP | H10157124 | 6/1998 |
| JP | H10202889 | 8/1998 |
| JP | H11186035 | 7/1999 |
| JP | 2008149687 | 7/2008 |

OTHER PUBLICATIONS

International Search Report and Written Opinion dated Apr. 23, 2014 issued on PCT Patent Application No. PCT/US2013/050205 dated Jul. 12, 2013, Korean Intellectual Property Office.

Nishiyama et al., A Prominent Ni—Cr—Si—Cu Alloy Resisting in Metal Dusting, Mar. 13-17, 2011, http://journals.cambridge.org/action/displayAbstract;jsessionid=07E4EBFC289DC376708FCE7D1EFDBA1E.journals?fromPage=online&aid=8177368.

Saris et al., Stability of Thin Film Amorphous Metal Alloys, 1998, vol. 54, http://journals.cambridge.org/action/displayAbstract;jsessionid=07E4EBFC289DC376708FCE7D1EF.

* cited by examiner

THERMAL INKJET PRINTHEAD STACK WITH AMORPHOUS METAL RESISTOR

CLAIM FOR PRIORITY

The present application is a national stage filing under 35 U.S.C. §371 of PCT application number PCT/US2013/050205, having an international filing date of Jul. 12, 2013, the disclosure of which is hereby incorporated by reference in its entirety.

BACKGROUND

Thin metal films can be used in various applications such as electronic semiconductor devices, optical coatings, and printing technologies. As such, once deposited, thin metal films can be subjected to harsh environments. Such thin films may be subjected to high heat, corrosive chemicals, etc.

For example, in a typical inkjet printing system, an inkjet printhead ejects fluid (e.g., ink) droplets through a plurality of nozzles toward a print medium, such as a sheet of paper, to print an image onto the print medium. The nozzles are generally arranged in one or more arrays, such that properly sequenced ejection of ink from the nozzles causes characters or other images to be printed on the print medium as the printhead and the print medium are moved relative to each other.

Unfortunately, because the ejection process is repeated thousands of times per second during printing, collapsing vapor bubbles also have the adverse effect of damaging the heating element. The repeated collapsing of the vapor bubbles leads to cavitation damage to the surface material that coats the heating element. Each of the millions of collapse events ablate the coating material. Once ink penetrates the surface material coating the heating element and contacts the hot, high voltage resistor surface, rapid corrosion and physical destruction of the resistor soon follows, rendering the heating element ineffective. There are also other examples of systems, outside of the inkjet arts, where structures may undergo contact with harsh environments. As such, research and development continues in the area of thin metal films used in various applications that can provide improved performance.

BRIEF DESCRIPTION OF THE DRAWINGS

Additional features and advantages of the disclosure will be apparent from the detailed description which follows, taken in conjunction with the accompanying drawings, which together illustrate, by way of example, features of the present technology.

Figure 1:
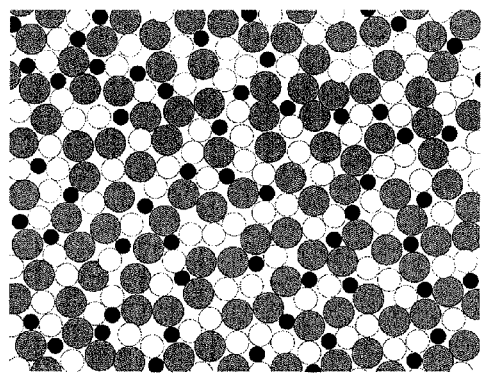
FIG. 1 is a figure of a schematic cross-sectional view of a distribution of elements of a three component amorphous thin metal film in accordance with one example of the present disclosure.

Reference will now be made to the exemplary embodiments illustrated, and specific language will be used herein to describe the same. It will nevertheless be understood that no limitation of the scope of the disclosure is thereby intended.

DETAILED DESCRIPTION

Before the present technology is disclosed and described, it is to be understood that this disclosure is not limited to the particular process steps and materials disclosed herein because such process steps and materials may vary somewhat. It is also to be understood that the terminology used herein is used for the purpose of describing particular examples only. The terms are not intended to be limiting because the scope of the present technology is intended to be limited only by the appended claims and equivalents thereof.

It has been recognized that it would be advantageous to develop amorphous thin metal films that are stable, having robust chemical, thermal, and mechanical properties. Specifically, it has been recognized that many thin metal films generally have a crystalline structure that possess grain boundaries and a rough surface. Notably, such characteristics hamper the thin metal film's chemical, thermal, and mechanical properties. However, thin metal films can be made from a three component system providing a stable and amorphous structure having superior chemical, thermal, and mechanical properties.

In accordance with this, the present disclosure is drawn to a thermal inkjet printhead stack including an insulated substrate and a resistor. The resistor can be applied to the insulated substrate. The resistor can include an amorphous layer of from 5 atomic % to 90 atomic % of a metalloid of carbon, silicon, or boron; from 5 atomic % to 90 atomic % of a first metal of titanium, vanadium, chromium, cobalt, nickel, zirconium, niobium, molybdenum, rhodium, palladium, hafnium, tantalum, tungsten, iridium, or platinum; and from 5 atomic % to 90 atomic % of a second metal of titanium, vanadium, chromium, cobalt, nickel, zirconium, niobium, molybdenum, rhodium, palladium, hafnium, tantalum, tungsten, iridium, or platinum. The second metal in this example is different than the first metal. The metalloid, the first metal, and the second metal can account for at least 70 atomic % of the amorphous thin metal film. Alternatively, two components of the metalloid, the first metal, and the second metal can account for at least 70 atomic % of the amorphous thin metal film. In yet another example, the metalloid, the first metal, and the second metal can account for at least 90 atomic %, or even 100 atomic % of the resistor. Furthermore, in each of the above ranges, e.g., for the metalloid, the first metal, and/or the second metal, the lower end of the range can be modified independently to 10 atomic %, or 20 atomic %. Likewise, the upper end of these ranges can be modified independently to 85 atomic %, 80 atomic %, or 70 atomic %.

A method of manufacturing a thermal inkjet printhead stack can include applying an amorphous thin metal resistor to an insulated substrate, applying a pair of conductors in electrical communication with the amorphous thin metal resistor, and applying passivation layers to the pair of conductors. The amorphous thin metal resistor can be of the same material described above, e.g., the metalloid, the first metal, and the second metal as part of an amorphous film. The step of applying the amorphous think metal resistor to the insulated substrate can include sputtering, atomic layer deposition, chemical vapor deposition, electron beam evaporation, or thermal evaporation. In one example, the step of applying the amorphous thin metal resistor to an insulated substrate includes sputtering a target containing a blend of the specified atoms onto the insulated substrate. With specific reference to sputtering, this can be carried out, for example, at 5 to 15 mTorr at a deposition rate of 5 to 10 nm/min with the target approximately 4 inches from a stationary substrate. Other deposition conditions may be used and other deposition rates can be achieved depending on variables such as target size, electrical power used, pressure, sputter gas, target to substrate spacing and a variety of other deposition system dependent variables. In another aspect, depositing can be performed in the presence of a dopant that is incorporated into the thin film. In another specific aspect, the dopant can be oxygen and/or nitrogen.

In still another example, a method of thermal inkjet printing can include thermally inkjetting a droplet of inkjet ink from an inkjet printhead using a heating resistor. The heating resistor can also be of the same material described above, e.g., the metalloid, the first metal, and the second metal as part of an amorphous film.

In each of these examples, from 5 atomic % to 85 atomic % of a third metal can be present as well, and can include metals such as titanium, vanadium, chromium, cobalt, nickel, zirconium, niobium, molybdenum, rhodium, palladium, hafnium, tantalum, tungsten, iridium, or platinum. In this example, the third metal is different than the first metal and the second metal. This range of metalloid, first metal, and second metal can likewise be independently modified at the lower end to 10 atomic %, or 20 atomic %, and/or at the upper end to 80 atomic %, or 70 atomic %. Furthermore, in one example, the metalloid, the first metal, the second metal, and the third metal can account for at least 80 atomic %, at least 90 atomic %, or even 100 atomic % of the resistor.

The thermal printhead stack can also include a pair of conductors electrically coupled with the resistor. In this example, the pair of conductors may also include passivation layers, respectively, applied to a top surface of the pair of conductors, but not to the resistor. In another example, though the resistor material is resistant to the corrosive nature of many inkjet inks, in one example, an electrically insulating film can also be applied to the resistor. When both the conductors are coated with dielectric layers (passivation layers and electrically insulating film), a common passivation or electrically insulating film can be used, or separate material coating layers can be used.

With specific reference to the material used to prepare the resistor, three or four (or more) component amorphous blends can be prepared. As mentioned, one of the components can be a metalloid, and the other two or three components can be a Group IV, V, VI, IX, or X (4, 5, 6, 9, or 10) metals. These three or four component mixtures of elements can be blended in a manner and in quantities that the mixture is homogenous when applied to the substrate. As mentioned, the mixture can be applied to a suitable substrate using any of a number of deposition techniques, as mentioned. By using these three or four (or more) components in high enough concentrations, a "confusion" of sizes and properties disfavors the formation of lattice structures that are more typical in single component or even two component systems. Selecting components with suitable size differentials can contribute to minimizing crystallization of the structure. For example, the amorphous thin metal film may have an atomic dispersity of at least 12% between two of the elements. In another aspect, the amorphous thin metal film may posess an atomic dispersity of at least 12% between three of elements, e.g., metalloid, first metal, and second metal. As used herein, "atomic dispersity" refers to the difference in size between the radii of two atoms. In one example, the atomic dispersity can be at least 15%, and in one aspect, can be at least 20%. The atomic dispersity between components can contribute to the desirable properties of the present films, including thermal stability, oxidative stability, chemical stability, and surface roughness, which are not achieved by some other thin metal films. Oxidative stability can be measured by the amorphous thin metal film's oxidation temperature and/or oxide growth rate as discussed herein.

In many thin film stacks, tantalum (Ta) is commonly used, such as for certain top coatings, as it is chemically resistant to many inks and also resists mechanical cavitation forces from bubble collapse. However, in most thin film applications, tantalum and other metals are deposited in a crystalline form. This leads to grain boundaries and an intrinsically rough surface. Oxide growth in crystalline materials typically follows these grain boundaries, and film consumption by oxidation is one major failure mode of inkjet resistor film stacks capped with crystalline metals. In addition, grain boundaries can promote crack propagation and limit mechanical robustness. Thus, it has been recognized that amorphous metal films, such as those described herein, can be used that are very heat and chemical resistant, and thus, can be used without other protective coatings or with only thin insulating protective coatings. Thus, the typical tantalum top coating can be completely removed in some examples.

With respect to resistors per se, the materials of the present disclosure can provide a suitable substitute for tantalum and aluminum alloys, as they are resistant to chemical attack by ink jet inks, and are inherently mechanically resistant to fracture due to the lack of grain boundaries. These materials are thermally stable in the temperature range typically used for thermal inkjet imaging with aqueous inkjet inks. Additionally, less energy may be used since the resistor can be formed and used without additional coatings, or with only a relatively thin dielectric coating as described previously. For example, in typical thermal inkjet ink systems, the stack might include a 2500 angstrom passivation layer and a 5000 angstrom tantalum layer. By removing the tantalum layer and reducing the thickness of the passivation layer (or eliminating it altogether, a significant reduction in the amount of energy required to eject an ink drop can be achieved. By reducing energy needed for firing, improvement in firing frequency can also be realized.

Figure 2:
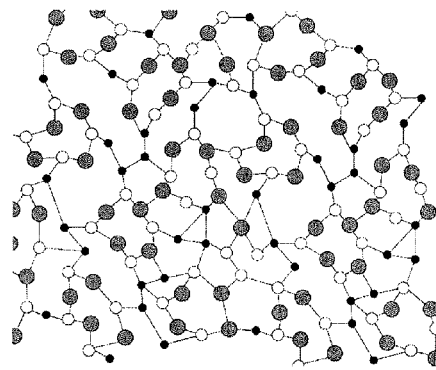
FIG. 2 is a figure of a lattice structure of a three component amorphous thin metal film in accordance with one example of the present disclosure.
Figure 3:
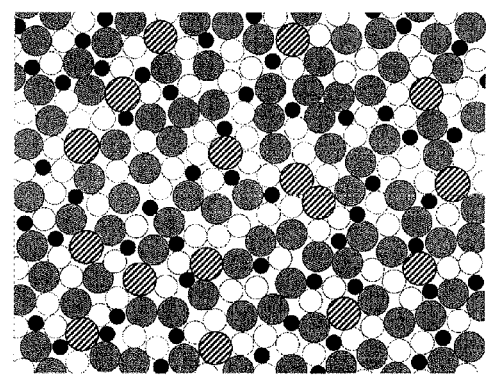
FIG. 3 is a figure of a schematic cross-sectional view of a distribution of elements of a four component amorphous thin metal film in accordance with one example of the present disclosure.
Figure 4:
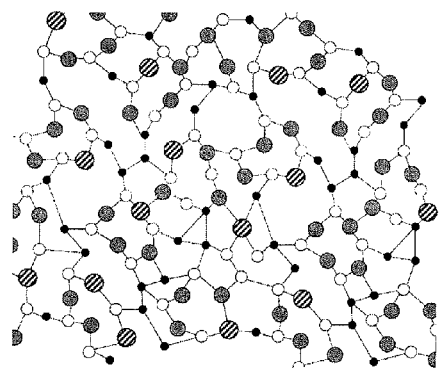
FIG. 4 is a figure of a lattice structure of a four component amorphous thin metal film in accordance with one example of the present disclosure.

Turning now to FIGS. 1 and 3, the present thin metal films (three and four component films, respectively) can have a distribution of components with a desirable atomic dispersity. Notably, the present thin metal films can be generally amorphous with a smooth, grain-free structure. Turning now to FIGS. 2 and 4, the lattice structure of the present amorphous thin metal films is represented, which are non-crystalline. More crystalline structures tend to have more defined grain boundaries, which can be less desirable for chemical resistivity, particularly in an inkjet thermal resistor system which undergoes both high temperature (for jetting) and chemical attack (from the ink), simultaneously. It is noted that FIGS. 1-4 are presented theoretically. Similarities between the three and four component systems is not intended to infer identical general structures, bonding sites, bonding lengths, etc. Thus, it is understood that these FIGS. are schematic in nature only and are presented for purposes of depicting the general amorphous nature of the various structures, and not to infer similarly between two specific amorphous films.

As discussed herein, the present amorphous thin metal films can have exceptional properties including thermal stability, oxidative stability, low surface roughness, and suitable resistivity for thermal inkjet applications. In one example, the present thin metal films can have a root mean square (RMS) roughness of less than 1 nm. In one aspect, the RMS roughness can be less than 0.5 nm. In another aspect, the RMS roughness can be less than 0.1 nm. One method to measure the RMS roughness includes measuring atomic force microscopy (AFM) over a 100 nm by 100 nm area. In other aspects, the AFM can be measured over a 10 nm by 10 nm area, a 50 nm by 50 nm area, or a 1 micron by 1 micron area. Other light scattering techniques can also be used such as x-ray reflectivity or spectroscopic ellipsometry.

In another example, the amorphous thin metal film can have a thermal stability of at least 400° C. In one aspect, the thermal stability can be at least 800° C. In another aspect, the thermal stability can be at least 900° C. As used herein, "thermal stability" refers to the maximum temperature that the amorphous thin metal film can be heated while maintaining an amorphous structure. One method to measure the thermal stability includes sealing the amorphous thin metal film in a quartz tube, heating the tube to a temperature, and using x-ray diffraction to evaluate the atomic structure and degree of atomic ordering.

In still another example, the amorphous thin metal film can have an oxidation temperature of at least 700° C. In one aspect, the oxidation temperature can be at least 800° C., and in another aspect, at least 1000° C. As used herein, the oxidation temperature is the maximum temperature that the amorphous thin metal film can be exposed before failure of the thin film due to stress creation and embrittlement of the partially or completely oxidized thin film. One method to measure the oxidation temperature is to heat the amorphous thin metal film at progressively increasing temperatures in air until the thin film cracks and flakes off the substrate.

In another example, the amorphous thin metal film can have an oxide growth rate of less than 0.05 nm/min. In one aspect, the oxide growth rate can be less than 0.04 nm/min, or in another aspect, less than 0.03 nm/min. One method to measure the oxide growth rate is to heat the amorphous thin metal film under air (20% oxygen) at a temperature of 300° C., measure the amount of oxidation on the amorphous thin metal film using spectroscopic ellipsometry periodically, and average the data to provide a nm/min rate. Depending on the components and the method of manufacture, the amorphous thin metal film can have a wide range of electric resistivity, including within ranges from 100 µΩ·cm to 10000 µΩ·cm, 150 µΩ·cm to 4500 µΩ·cm, 150 µΩ·cm to 2000 µΩ·cm, or 200 µΩ·cm to 1000 µΩ·cm. Resistivity outside of this range can also be achieved.

Generally, the amorphous thin metal film can have a negative heat of mixing. As discussed herein, the present thin metal films generally include a metalloid, a first metal, and a second metal, where the first and second metal can include elements selected from Periodic Table Groups IV, V, VI, IX, and X (4, 5, 6, 9, and 10). In one example, the amorphous thin metal films can include a refractory metal selected from the group of titanium, vanadium, chromium, zirconium, niobium, molybdenum, rhodium, hafnium, tantalum, tungsten, and iridium. In one aspect, the first and/or second metal can be present in the thin film in an amount ranging from 20 at % to 90 at %. In another aspect, the first and/or second metal can be present in the thin film in an amount ranging from 20 at % to 40 at %.

Additionally, the amorphous thin metal films can further include a dopant. In one example, the dopant can include nitrogen, oxygen, and mixtures thereof. The dopant can generally be present in the amorphous thin metal film in an amount ranging from 0.1 at % to 15 at %. In one example, the dopant can be present in an amount ranging from 0.1 at % to 5 at %. Smaller amounts of dopants can also be present, but at such low concentrations, they would typically be considered impurities. Additionally, in one aspect, the amorphous thin metal film can be devoid of aluminum, silver, and gold.

Generally, the amorphous thin metal film can have a thickness ranging from 10 angstroms to 1 micron. In one example, the thickness can be from 10 angstroms to 0.5 microns. In one aspect, the thickness can be from 0.02 microns to 0.3 microns.

Figure 5:
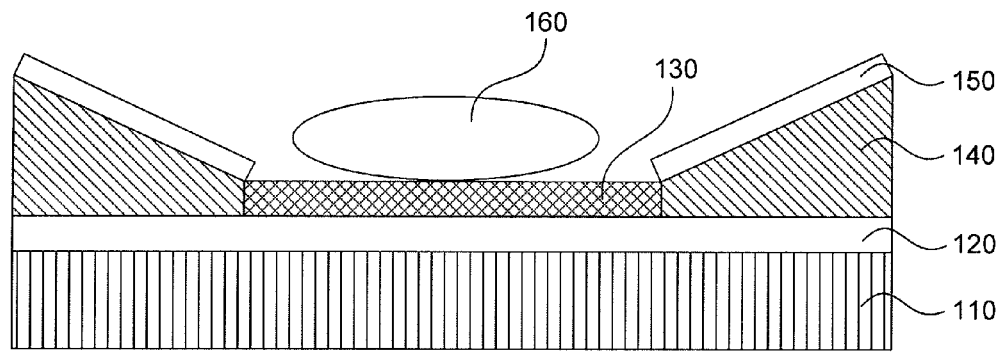
FIG. 5 is a cross-sectional schematic view of a portion of a thermal inkjet printhead stack in accordance with an example of the present disclosure.
Figure 6:
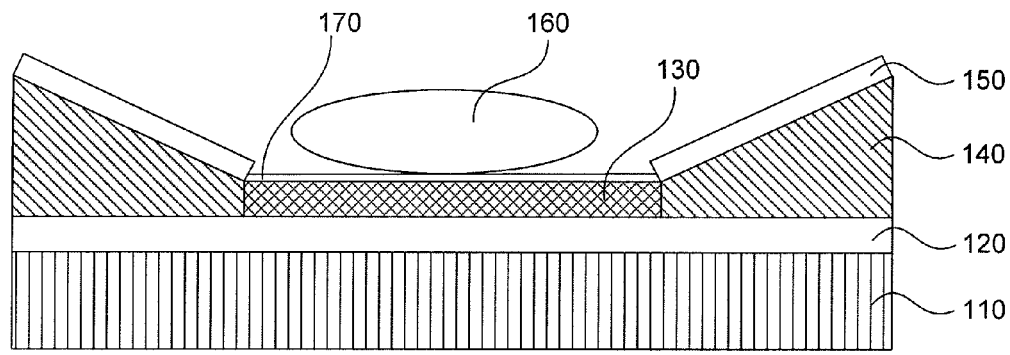
FIG. 6 is a cross-sectional schematic view of a portion of a thermal inkjet printhead stack in accordance with an alternative example of the present disclosure.
Figure 7:
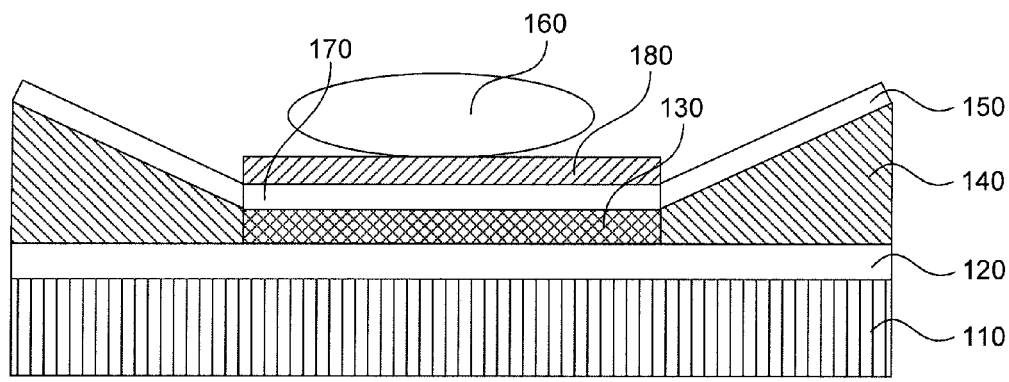
FIG. 7 is a cross-sectional schematic view of a portion of a thermal inkjet printhead stack in accordance with an alternative example of the present disclosure.

Turning now to FIGS. 5-7, three example structures are shown that would be suitable for a thin film stack for use in a thermal inkjet printhead. Specifically, a silicon wafer 110 is shown having an electrical insulating layer 120 applied thereto. In this example, the silicon wafer with the electrical insulating layer make up the "insulated substrate" described herein, as the surface is insulated from the semi-conductive silicon substrate. Thus, the term "insulated substrate" means that the surface of the substrate where the resistor is applied is insulating. That being stated, any substrate that is insulating can be used of any arrangement known in the art. A suitable average thickness for the electrical insulating layer can be from 0.5 microns to 2 microns.

To the insulating layer 120 is applied the resistor 130, which is amorphous. Any of the materials described herein that include a metalloid (Si, C, or B) and two or more metals of Groups IV, V, VI, IX, and X can be selected for use for the resistor. A suitable average thickness for the resistor can be from 0.02 microns to 0.3 microns, though thicknesses outside of this range can also be used. Furthermore, the resistor, as described, can be doped with any material suitable for achieving desired electrical properties, including, but not limited to, resistivity. The resistor is likewise in electrical communication with a pair of conductors 140 positioned on either side of the resistor. These conductors can act as electrodes for the resistor. In this example, the conductors are also applied to the insulating layer, though this arrangement is merely exemplary. The conductors can be of any material known in the art, but in one example, the conductors can be aluminum, or an alloy of aluminum and copper.

Furthermore, passivation layers 150, which are also insulating, are applied to the conductors to prevent contact between the ink 160 and the conductors. A suitable average thickness for the conductors can be from 0.1 microns to 2 microns, for example, and a suitable average thickness for the passivation layers can be from 0.05 microns to 1 micron. Again, thicknesses outside of these ranges can also be used in some examples. Optionally, though the resistor 130 is highly effective with respect to its ink-resistive and heat stability properties, an electrical insulating film 170 can likewise be applied to the resistor, such is shown in FIGS. 6 and 7. This film can be relatively thin to relatively thick, e.g., from 50 angstroms to 5000 angstroms, from 50 angstroms to 2500 angstroms, from 100 angstroms to 1000 angstroms, from 100 angstroms to 500 angstroms, from 100 angstroms to 200 angstroms, etc. Even at 2500 angstroms, many state of the art systems often use somewhere on the order of 5000 angstroms of tantalum and other coatings over as a topmost layer or layers to prevent chemical deterioration, and thus, the ability to use an insulating coating that reduces the thickness compared to typical dielectric coating thickness is an advancement in the art. That being stated, as shown in FIG. 7, a top metallic coating 180 can also be used as is typical in this field, with the new resistor materials described herein to improved effect compared to state of the art resistors.

Insulating materials that can be used for the electrical insulating layer 120, the passivation layers 150, the thin electrical insulating film 170, or any other insulating layer can be SiN, $SiO_2$, $HfO_2$, $ZrO_2$, $Al_2O_3$, or other commonly used dielectric materials. The thin electrical insulating film, for example, can be formed by thermal oxidation of the amorphous metal film or deposition of an electrically insulating thin film. Also, it is noted that the thin electrical insulating film can be integrated with or of the same material as the passivation layers 150. Other layers can also be used as would be appreciated by one skilled in the art after considering the present disclosure.

It is noted that, as used in this specification and the appended claims, the singular forms "a," "an," and "the" include plural referents unless the context clearly dictates otherwise.

As used herein, "devoid of" refers to the absence of materials in quantities other than trace amounts, such as impurities.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 at % to about 5 at %" should be interpreted to include not only the explicitly recited values of about 1 at % to about 5 at %, but also include individual values and sub-ranges within the indicated range. Thus, included in this numerical range are individual values such as 2, 3.5, and 4 and sub-ranges such as from 1-3, from 2-4, and from 3-5, etc. This same principle applies to ranges reciting only one numerical value. Furthermore, such an interpretation should apply regardless of the breadth of the range or the characteristics being described.

EXAMPLES

The following examples illustrate embodiments of the disclosure that are presently known. Thus, these examples should not be considered as limitations of the disclosure, but are merely in place to teach how to make thermal inkjet printheads presently known. As such, a representative number of compositions, amorphous thin film stacks, and their method of manufacture are disclosed herein.

Example 1

Thin Metal Films

Various thin metal films were prepared by DC and RF sputtering at 5 mTorr to 15 mTorr under argon, RF at 50 W to 100 W, and DC at 35 W to 55 W on to a silicon wafer. The resulting film thickness was in the range of 100 nm to 500 nm. The specific components and amounts are listed in Table 1.

TABLE 1

| Thin Film Composition | Ratio (atomic %) | Ratio* (weight %) |
| --- | --- | --- |
| TaNiSi | 40:40:20 | 71:23:6 |
| TaWSi | 40:40:20 | 48:49:4 |
| TaWSi | 30:50:20 | 36:61:4 |
| TaMoSi | 40:40:20 | 62:33:5 |
| TaPtSi | 40:40:20 | 46:50:4 |
| TaWNiSi | 35:35:10:20 | 45:46:4:4 |

*Weight ratio calculated from atomic % and rounded to the nearest integer

Example 2

Thin Metal Films

Various thin metal films are prepared by DC and RF sputtering at 5 mTorr to 15 mTorr under argon, RF at 50 W to 100 W, and DC at 35 W to 55 W on to a silicon wafer. The resulting film thickness is in the range of 100 nm to 500 nm. The specific components and amounts are listed in Table 2.

TABLE 2

| Thin Film Composition | Ratio (atomic %) | Ratio* (weight %) |
| --- | --- | --- |
| TaCoB | 60:30:10 | 85:14:1 |
| NbWB | 50:40:10 | 38:61:1 |
| MoPtC | 40:50:10 | 28:71:1 |
| WTiC | 30:40:30 | 71:25:5 |
| MoNiSi | 45:40:5 | 63:35:2 |
| TaWNiB | 35:35:10:20 | 47:47:4:2 |

*Weight ratio calculated from atomic % and rounded to the nearest integer

Example 3

Thin Metal Film Properties

The amorphous thin metal films of Example 1 were tested for electrical resistivity, thermal stability, chemical stability, oxidation temperature, oxide growth rate. The results are listed in Table 3. All of the films had a surface RMS roughness of less than 1 nm.

Surface RMS roughness was measured by atomic force microscopy (AFM). Electrical resistivity was measured by co-linear four point probe for different deposition conditions providing the range listed in Table 3. Thermal Stability was measured by sealing the amorphous thin metal film in a quartz tube at approximately 50 mTorr and annealing up to the temperature reported with x-ray confirmation of the amorphous state, where the x-ray diffraction patterns showed evidence of Bragg reflections. Chemical stability was measured by immersing the amorphous thin metal film in Hewlett Packard commercial inks CH602SERIES, HP Bonding Agent for Web Press; CH585SERIES, HP Bonding Agent for Web Press; and CH598SERIES, HP Black Pigment Ink for Web Press; at 55° C. and checked at 2 and 4 weeks. Adequate chemical stability was present with the thin film when it showed no visual physical change or delamination, indicated by a "Yes" in Table 3. Oxidation temperature was measured as the maximum temperature that the amorphous thin metal film can be exposed before failure of the thin film due to stress creation and embrittlement of the partially or completely oxidized thin film. Oxide growth rate was measured by heating the amorphous thin metal film under air (20% oxygen) at a temperature of 300° C., measuring the amount of oxidation on the amorphous thin metal film using spectroscopic ellipsometry periodically over a periods of 15, 30, 45, 60, 90, and 120 minutes, and then at 12 hours, and averaging the data to provide a nm/min rate.

TABLE 3

| Thin Film Composition | Ratio (at. %) | Electric Resistivity ($\mu\Omega \cdot cm$) | Thermal Stability (° C.) | Chemical Stability | Oxidation Temperature (° C.) | Oxide Growth Rate (nm/min) |
|---|---|---|---|---|---|---|
| TaNiSi | 40:40:20 | 230-440 | 500 | Yes | 700 | 0.035 |
| TaWSi | 40:40:20 | 210-255 | 900 | Yes | 1000 | 0.027* |
| TaWSi | 30:50:20 | 210-1500 | 900 | Yes | Not tested | 0.049* |
| TaMoSi | 40:40:20 | 165-1000 | 900 | Yes | Not tested | 0.132* |
| TaPtSi | 40:40:20 | 300 | 400 | Yes | Not tested | 0 |
| TaWNiSi | 35:35:10:20 | 200-440 | 800 | Yes | 800 | 0.039* |

*Showed evidence of passivation (decreased growth rate) after appox. 60 minutes

Example 4

Resistivity Comparison

For comparison, the resistivity for a typical tantalum-aluminum alloy used as a resistor in inkjet ink printheads was compared to a specific TaWSi alloy, such as one set forth in Table 3 above. The specific resistivity for the TaAl alloy that is usable in an inkjet printhead was ~220 $\mu\Omega \cdot cm$. The specific resistivity of the TaWSi alloy prepared as a comparison was ~230 $\mu\Omega \cdot cm$, which is very comparable in resistivity to known TaAl resistors.

While the disclosure has been described with reference to certain embodiments, those skilled in the art will appreciate that various modifications, changes, omissions, and substitutions can be made without departing from the spirit of the disclosure. It is intended, therefore, that the disclosure be limited only by the scope of the following claims.

What is claimed is:

1. A thermal inkjet printhead stack with an amorphous metal resistor, comprising:
    an insulated substrate:
    a resistor applied to the insulated substrate, the resistor comprising an amorphous metal layer of:
        5 atomic % to 90 atomic % of a metalloid, wherein the metalloid is carbon, silicon, or boron,
        5 atomic % to 90 atomic % of a first metal, wherein the first metal is titanium, vanadium, chromium, cobalt, nickel, zirconiuM, niobium, molybdenum, rhodium, palladium, hafnium, tantalum, tungsten, iridium, or platinum, and
        5 atomic % to 90 atomic of a second metal, wherein the second metal is titanium, vanadium, chromium, cobalt, nickel, zirconium, niobium, molybdenum, rhodium, palladium, hafnium, tantalum, tungsten, iridium, or platinum, wherein the second metal is different than the first metal,
    wherein the metalloid, the first metal, and the second metal account for at least 70 atomic % of the amorphous metal layer.

2. The thermal inkjet printhead stack of claim 1, wherein the amorphous layer further comprises from 5 atomic % to 85 atomic % of a third metal, wherein the third metal is titanium, vanadium, chromium, cobalt, nickel, zirconium, niobium, molybdenum, rhodium, palladium, hafnium, tantalum, tungsten, iridium, or platinum, wherein the second metal is different than the first metal and the second metal.

3. The thermal inkjet printhead stack of claim 1, further comprising a pair of conductors electrically coupled with the resistor, the pair of conductors including passivation layers applied to a top surface of the pair of conductors, but not to the resistor.

4. The thermal inkjet printhead stack of claim 1, further comprising a thin electrical insulating film applied to the resistor.

5. The thermal inkjet printhead stack of claim 1, Wherein the amorphous film of the resistor further comprises from 0.1 atomic % to 15 atomic % of a dopant, the dopant being nitrogen, oxygen, or mixtures thereof.

6. The thermal inkjet printhead stack of claim 1, wherein the amorphous film of the resistor has a surface RMS roughness of less than 1 nm.

7. The thermal inkjet printhead stack of claim 1, wherein the amorphous film of the resistor has a thermal stability of at least 400° C. and has an oxidation temperature of at least 700° C.

8. The thermal inkjet printhead stack of claim 1, wherein the amorphous film of the resistor has an oxide growth rate of less than 0.05 nm/min.

9. The thermal inkjet printhead stack of claim 1, wherein the amorphous film of the resistor has an atomic dispersity of at least 12% between at least two of the metalloid, the first metal, and the second metal relative to one another.

10. The thermal inkjet printhead stack of claim 1, wherein the amorphous film of the resistor has an atomic dispersity of at least 12% between each of the metalloid, the first metal, and the second metal relative to one another.

11. The thermal inkjet printhead stack of claim 1, wherein the amorphous film of the resistor has a bulk resistivity from about 100 to 10000 $\mu\Omega \cdot cm$.

12. The thermal inkjet printhead stack of claim 1, wherein the resistor comprising the amorphous metal layer has a thickness of less than 0.8 micron.

13. The thermal inkjet printhead stack of claim 12, wherein the resistor comprising the amorphous metal layer has a thickness of greater than 0.01 micron.

14. A method of manufacturing a thermal inkjet printhead stack with an amorphous metal resistor, comprising:
  applying an amorphous film in the form of a thermal inkjet resistor to an insulated substrate, the amorphous film, comprising:
    5 atomic to 90 atomic % of a metalloid, wherein the metalloid is carbon, silicon, or boron;
    5 atomic % to 90 atomic % of a first metal, wherein the first metal is titanium, vanadium, chromium, cobalt, nickel, zirconium, niobium, molybdenum, rhodium, palladium, hafnium, tantalum, tungsten, iridium, or platinum; and
    5 atomic to 90 atomic of a second metal, wherein the second metal is titanium, vanadium, chromium, cobalt, nickel, zirconium, niobium, molybdenum, rhodium, palladium, hafnium, tantalum, tungsten, iridium, or platinum, and
    wherein the second metal is different than the first metal;
  applying a pair of conductors to the insulated substrate and in electrical communication with the amorphous thin metal resistor; and
  applying passivation layers to the pair of conductors, thereby chemically and electrically isolating the conductors from contact with an inkjet ink when loaded.

15. The method of claim 14, further comprising the step of applying one or more protective layers to the resistor.

16. The method of claim 14, Wherein the amorphous thin metal resistor further comprises from 5 atomic % to 85 atomic % of a third metal, wherein the third metal is titanium, vanadium, chromium, cobalt, nickel, zirconium, niobium, molybdenum, rhodium, palladium, hafnium, tantalum, tungsten, iridium, or platinum, Wherein the second metal is different than the first metal and the second metal.

17. A method of thermal inkjet printing, comprising thermally inkjetting a droplet of inkjet ink from an inkjet printhead using a heating resistor, comprising:
  5 atomic % to 90 atomic % of a metalloid, wherein the metalloid is carbon, silicon, or boron;
  5 atomic % to 90 atomic % of a first metal, wherein the first metal is titanium, vanadium, chromium, cobalt, nickel, zirconium, niobium, molybdenum, rhodium, palladium, hafnium, tantalum, tungsten, iridium, or platinum; and
  5 atomic to 90 atomic % of a second metal, wherein the second metal is titanium, vanadium, chromium, cobalt, nickel, zirconium, niobium, molybdenum, rhodium, palladium hafnium, tantalum, tungsten, iridium, or platinum, and wherein the second metal is different than the first metal.

* * * * *